(12) United States Patent
Miyake et al.

(10) Patent No.: US 8,507,339 B2
(45) Date of Patent: Aug. 13, 2013

(54) BICMOS DEVICE

(75) Inventors: Shinichi Miyake, Kanagawa (JP); Kazuaki Tsunoda, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 340 days.

(21) Appl. No.: 12/950,178

(22) Filed: Nov. 19, 2010

(65) Prior Publication Data

US 2011/0121402 A1 May 26, 2011

(30) Foreign Application Priority Data

Nov. 20, 2009 (JP) ................. 2009-264602

(51) Int. Cl.
*H01L 21/8238* (2006.01)

(52) U.S. Cl.
USPC .............. 438/202; 257/E27.015; 438/234

(58) Field of Classification Search
USPC .......................................... 438/202
See application file for complete search history.

(56) References Cited

U.S. PATENT DOCUMENTS

| 6,352,887 B1 | 3/2002 | Hutter et al. |
| 6,835,983 B2 * | 12/2004 | Ning et al. .............. 257/347 |
| 2002/0130370 A1 * | 9/2002 | Suzuki ................... 257/378 |

FOREIGN PATENT DOCUMENTS

| JP | 2008-021671 | 1/2008 |
| JP | 2008021671 A * | 1/2008 |
| JP | 2009-016856 | 1/2009 |

* cited by examiner

*Primary Examiner* — Ajay K Arora
(74) *Attorney, Agent, or Firm* — Young & Thompson

(57) ABSTRACT

In a BiCMOS device, a device isolation film separating the bipolar transistor region from the MOS region is taller than the substrate at least where it contacts the bipolar transistor region, and is preferably taller than the same layer where it contacts the MOS transistor region. This makes it possible to maintain the processing accuracy of a MOS transistor while stabilizing the diode current characteristics of the bipolar transistor.

21 Claims, 23 Drawing Sheets

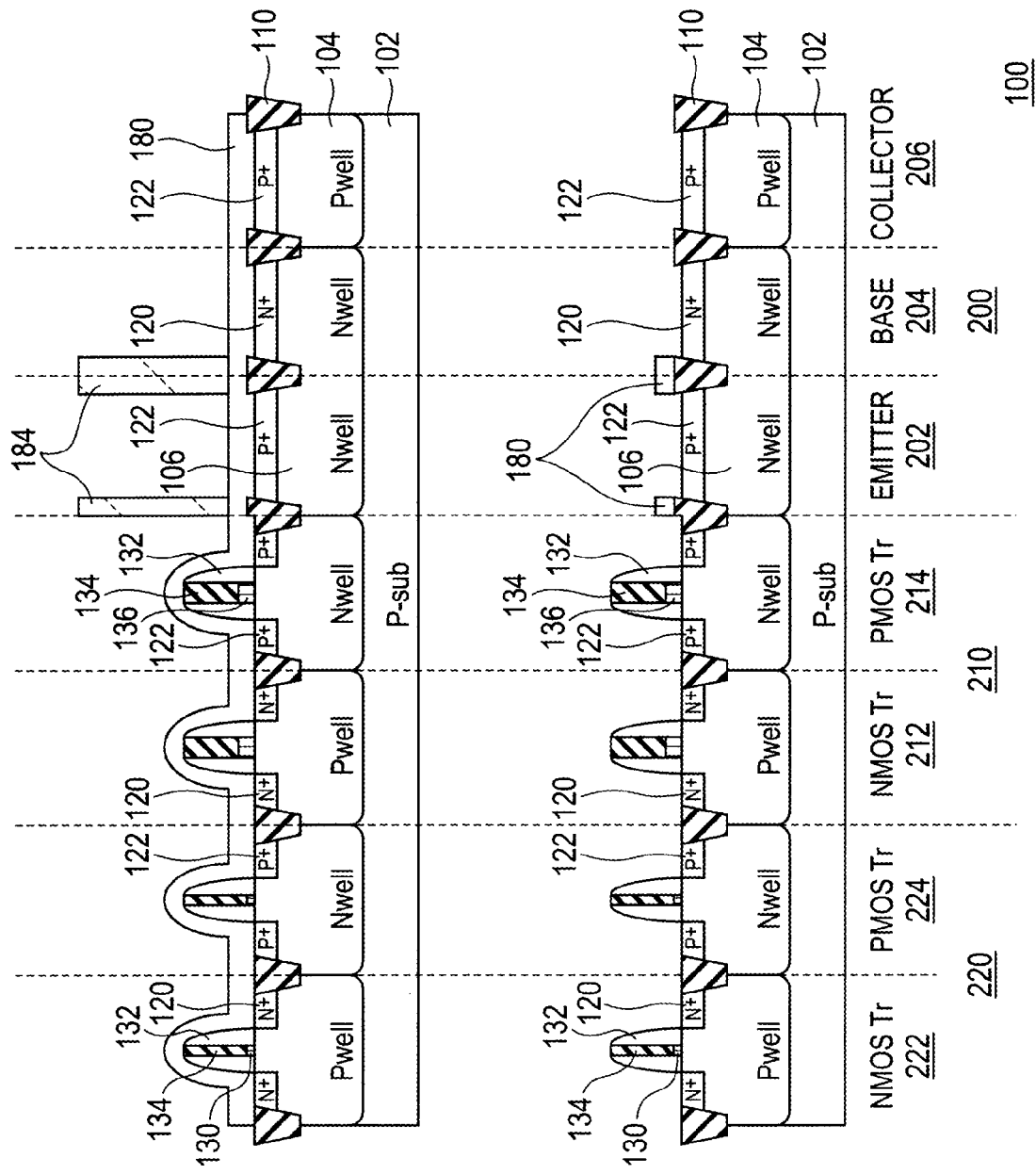

BICMOS DEVICE

CROSS-REFERENCE TO RELATED APPLICATIONS

The disclosure of Japanese Patent Application No. 2009-264602 filed on Nov. 20, 2009 including the specification, drawings and abstract is hereby incorporated by reference in its entirety.

BACKGROUND OF THE INVENTION

1. Field of the Invention

The present invention relates to a BiCMOS semiconductor device and a production method thereof.

2. Description of Related Art

In recent years, a semiconductor device wherein a bipolar transistor, for example, is formed simultaneously on a system LSI including a CMOS comprising a MOSFET (metal oxide semiconductor field-effect transistor) has been developed.

In Japanese Unexamined Patent Publication No. 2008-021671, a blocking layer for blocking the formation of a strain-imparting semiconductor region in a strained channel MOSFET is formed around a base region separated by an element separation layer, with the same process as that for forming the gate electrode section of a CMOS, thus allowing an emitter region formed simultaneously with the epitaxial growth of the strain-imparting semiconductor region to undergo epitaxial growth while being separated from the element separation layer. This document states that this technique avoids the occurrence of defects when the emitter region is formed in contact with the element separation layer, thus improving transistor characteristics without increasing the number of processes.

Meanwhile, in a MOSFET, a silicide layer is formed over the surface of a diffusion region constituting a source/drain region in order to decrease contact resistance with the source/drain region. In BiCMOS devices the bipolar transistor should be formed simultaneously in the CMOS forming process, to avoid additional processes. Thus, when a MOSFET and a bipolar transistor are formed simultaneously on a substrate, a silicide layer is also formed over the surface of a diffusion region constituting the bipolar transistor.

U.S. Pat. No. 6,352,887 describes a BiCMOS integrated circuit wherein a silicide layer is formed over the surface of a diffusion region. In particular, a photoresist is deposited at the end of an emitter region and over a field oxide region adjacent to the emitter region so as to cover a part of a laminated layer comprising a gate oxide layer and a silicide mask oxide; and an exposed gate oxide layer is removed. Thereafter, titanium is deposited to a thickness of about 30 nm, heat is applied at about 675° C. for about 30 minutes, and thus a silicide layer is formed at a site where the silicide mask oxide is not formed. This document states that, the absence of silicide at the periphery of the emitter reduces the chance of degraded gain ($h_{fe}$) from recombination effects at the emitter edge that result from uneven silicide thickness or spiking at the bird's beak region.

SUMMARY OF THE INVENTION

The present invention is based in part on the recognition that, when STI (shallow trench isolation) is used as a device isolation film, the upper regions of the STI layer are eroded, mainly from the processes of oxidizing a gate insulating film, forming a sidewall, and forming a silicide block during the formation of a CMOS. Consequently, the surface of the device isolation film is disadvantageously lowered relative to the surface of a diffusion layer on a substrate surface at the end of a junction where the diffusion layer touches the device isolation film. This gives rise to a problem wherein a silicide layer "sags" at the end of a junction where the diffusion layer touches the device isolation film.

The problem is illustrated in FIGS. 23A and 23B. In that example a bipolar transistor is a PNP diode comprising a P-type substrate (not designated) functioning as a collector, an N well 14 formed therein and functioning as a base, and a P$^+$ diffusion layer 10 formed above the N well and functioning as an emitter. If device isolation film 12 is eroded in the region where it contacts the P$^+$ diffusion layer 10, then when a metal film 16 of Co, Ni, Pt or the like is formed over the surface of the P$^+$ diffusion layer 10 and a silicide layer 18 is formed by the reaction between silicon and the metal film 16 (FIG. 23A), the metal film 16 reacts with the substrate not only at the horizontal interface between the metal film 16 and the P$^+$ diffusion layer 10, but also at a lateral interface corresponding to the region exposed by the erosion of the isolation film 12. The silicide layer 18 thus "sags", i.e., extends not only horizontally but also downwardly as it approaches and contacts the eroded isolation film 12, as shown in FIG. 23B.

The electric current that can pass through such a bipolar transistor is proportional to the inverse of the emitter width $W_E$ (P$^+$ diffusion layer depth $W_P$). The emitter width $W_E$ is dictated by the junction depth of the P$^+$ diffusion layer 10 and the film thickness of the silicide layer 18. Continued miniaturization of CMOS devices has led to the prevalence of shallow junctions to maintain short channel characteristics. Thus, when a MOSFET and a bipolar transistor are formed simultaneously over a substrate, the depth of the P$^+$ diffusion layer 10 is likewise shallow. Consequently, when a sagging silicide layer 18 is formed, the variation of the distance between the silicide layer 18 and the N well 14 has a corresponding greater influence on the operating characteristics of the bipolar transistor.

In U.S. Pat. No. 6,352,887, a silicidation mask is formed at the end of an emitter region and over a field oxide region adjacent to the emitter region so that a silicide layer may not be formed in the region. However, forming the silicide-free region in that manner may possibly cause variation of operating characteristics. Further, the end of a diffusion layer may be exposed undesirably because of poor processing dimension accuracy or poor lapping accuracy during the formation of the silicidation mask. In such a case, a silicide layer will be formed at some locations but not at others, resulting in undesirable variation of operating performance.

A preferred semiconductor device according to the invention comprises a substrate having a MOS transistor region and a bipolar transistor region including an emitter region, a base region, and a collector region; a device isolation film formed over the surface of the substrate and separating the regions; a MOS transistor formed in the MOS transistor region and having a source/drain region where a silicide layer is formed; and a bipolar transistor formed in the bipolar transistor region and having the emitter region, the base region, and the collector region where a silicide layer is formed, and a device isolation film for separating the bipolar transistor region and the MOS transistor region from each other wherein the device isolation film is taller than the surface of the substrate at the bipolar transistor side.

A preferred method according to the invention comprises forming a device isolation film for separating regions over a substrate having a MOS transistor region and a bipolar transistor region including an emitter region, a base region, and a collector region so that the height of the surface of the device isolation film is higher than the height of the surface of the substrate; forming an insulating film over the whole surface of the substrate; removing the insulating film in the MOS transistor region while at least shielding, with a mask, the device isolation film at a site where the device isolation film touches the emitter region of the bipolar transistor region; forming a gate insulating film over the surface of the substrate in the MOS transistor region; forming a conductive film comprised of a gate electrode over the gate insulating film to form the gate electrode; forming a sidewall on the side of the gate electrode; forming a silicide layer over a source/drain region of the MOS transistor region and over the emitter region, the base region, and the collector region of the bipolar transistor region, in which, in the step of forming the silicide layer, the device isolation film for separating the bipolar transistor region and the MOS transistor region from each other is formed higher than the surface of the substrate at the bipolar transistor side. Hereinabove, the emitter region in the bipolar transistor region may be a region adjacent to the device isolation film.

Since the device isolation film is taller than the substrate at least where it contacts the emitter region, then even if the isolation film is eroded it still will not be lower than the height of the surface of a substrate in the emitter region, as shown in FIGS. 23A and 23B. The device and method according to the invention thus make it possible to prevent the silicide layer from sagging at the end of the emitter region, and control the relationship between the silicide layer and a junction depth to a constant state. This helps to stabilize emitter width and thus to stabilize the diode current characteristics.

On the other hand, in the MOS transistor region, the gate electrode is formed not only over the diffusion layer but also over the device isolation film. Consequently, it is preferred that the height difference between the substrate and the device isolation film is small adjacent the MOS region so as to maintain gate processing accuracy when lithography is applied during gate forming. In a preferred embodiment, the height of the device isolation film where it contacts the MOS transistor region is less than its height where it contacts the emitter region. This helps to maintain gate processing accuracy.

BRIEF DESCRIPTION OF THE DRAWINGS

The above and other objects, advantages and features of the present invention will be more apparent from the following description taken in conjunction with the accompanying drawings, in which:

FIGS. 20A and 20B are sectional views illustrating steps of another alternative embodiment of a process for manufacturing a semiconductor device according to the invention;

DETAILED DESCRIPTION OF PREFERRED EMBODIMENTS

Figure 1:
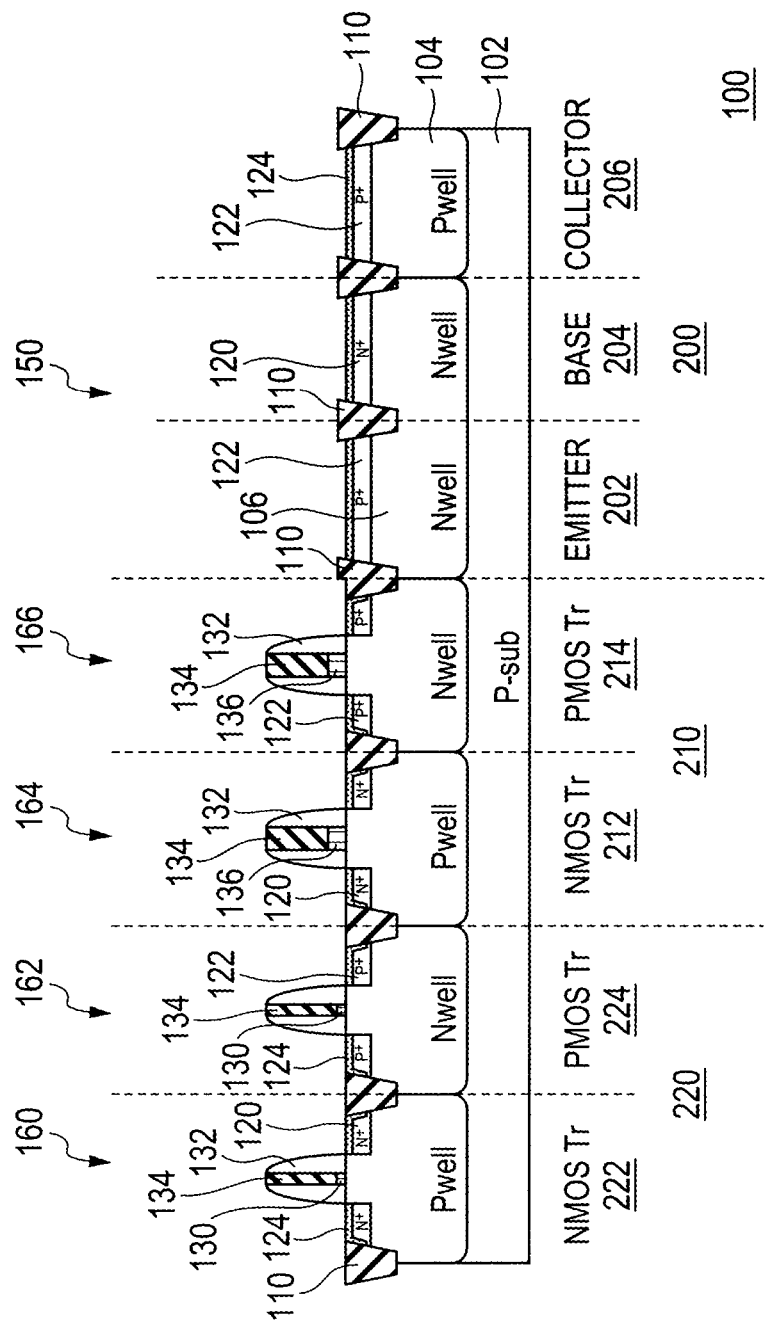
FIG. 1 is a sectional view of a semiconductor device according to an embodiment of the present invention.

In FIG. 1, a semiconductor device 100 includes a substrate 102 comprising a MOS transistor region (a core MOS transistor region 220 and an I/O region 210) where a MOS transistor is formed; and a bipolar transistor region 200, where a bipolar transistor 150 is formed, including an emitter region 202, a base region 204, and a collector region 206. In the present embodiment, the substrate 102 can be, for example, a semiconductor substrate such as a silicon substrate or the like. In the following embodiment, the case where a first conductivity type is P-type and a second conductivity type is N-type is shown as an example, but a reverse case is also acceptable.

Substrate 102 is a P-type substrate. An N well 106 is formed in a region comprising the emitter region 202 and the base region 204 of the bipolar transistor region 200. A p-doped region 122 is formed over the surface of the N well 106 in the emitter region 202. An n-doped region 120 is formed over the surface of the N well 106 in the base region 204. A P well 104 is formed in the collector region 206 of the bipolar transistor region 200. A p-doped region 122 is formed over the surface of the P well 104 in the collector region 206.

In the present embodiment, the bipolar transistor 150 can be a vertical-type PNP diode comprising the p-doped region 122 functioning as an emitter, the N well 106 functioning as a base, and the P-type substrate 102 functioning as a collector. More particularly, the base comprises the N well 106 in the emitter region 202 and the base region 204, and the n-doped region 120 of the base region 204; and a collector comprises the substrate 102 in the bipolar transistor region 200, and the P well 104 and the p-doped region 122 in the collector region 206.

I/O region 210 comprises an NMOS region 212 where an NMOS transistor 164 is formed and a PMOS region 214 where a PMOS transistor 166 is formed. The NMOS transistor 164 and the PMOS transistor 166 configure a CMOS. A P well 104 is formed in the NMOS region 212 of the I/O region 210. A gate comprising a gate insulating film 136, a gate electrode 134, and a sidewall 132 is formed over the P well 104 in the NMOS region 212. An n-doped region 120 is formed on both sides of the gate over the surface of the P well 104 in the NMOS region 212.

Likewise, an N well 106 is formed in the PMOS region 214 of the I/O region 210. A gate comprising a gate insulating film 136, a gate electrode 134, and a sidewall 132 is formed over the N well 106 in the PMOS region 214. A p-doped region 122 is formed on both sides of the gate over the surface of the N well 106 in the PMOS region 214.

The core MOS transistor region 220 comprises an NMOS region 222 where an NMOS transistor 160 is formed and a PMOS region 224 where a PMOS transistor 162 is formed. The NMOS transistor 160 and the PMOS transistor 162 configure a CMOS. A P well 104 is formed in the NMOS region 222 of the core MOS transistor region 220. A gate comprising a gate insulating film 130, a gate electrode 134, and a sidewall 132 is formed over the P well 104 in the NMOS region 222. An n-doped region 120 is formed on both sides of the gate over the surface of the P well 104 in the NMOS region 222.

Likewise, an N well 106 is formed in the PMOS region 224 of the core MOS transistor region 220. A gate comprising a gate insulating film 130, a gate electrode 134, and a sidewall 132 is formed over the N well 106 in the PMOS region 224. A p-doped region 122 is formed on both sides of the gate over the surface of the N well 106 in the PMOS region 224.

The gate insulating film 130 of the NMOS transistor 160 and the PMOS transistor 162 formed in the core MOS transistor region 220 is formed so as to have a film thickness thinner than that of the gate insulating film 136 of the NMOS transistor 164 and the PMOS transistor 166 formed in the I/O region 210.

A silicide layer 124 is formed over the surfaces of the n-doped regions 120 and the p-doped regions 122 of the bipolar transistor region 200, the I/O region 210, and the core MOS transistor region 220.

Further, each region is separated from an adjacent region with a device isolation film 110. Here, the height of the device isolation film 110 where it contacts the emitter region 202 is not lower than the height of the surface of the substrate 102 in the emitter region 202, and that height is greater than the height of the same device isolation film 110 where it contacts the I/O region 210 and greater than the height of the separate device isolation films 110 that contact the core MOS transistor region 220. In the present embodiment, throughout the bipolar transistor region 200, the height of the element-separating insulating films 110 is formed so as to be higher than the height of the films 110 where they contact each of the I/O region 210 and the core MOS transistor region 220. In the I/O region 210 and the core MOS transistor region 220, it is preferable that the device isolation film 110 is formed so that the height of the surface thereof may not be different from the height of the surface of the substrate 102 from the viewpoint of controlling variations in gate processing.

FIG. 1 is schematic, and the configuration of an actual semiconductor device according to the invention may differ therefrom. For example, although the emitter region 202 is located next to the PMOS region 214 in FIG. 1, it is also possible to locate the emitter region 202 next to another region. As a further example, it is also possible to configure the emitter region 202 so as to be surrounded from all directions by the base region 204 or the collector region 206.

The present embodiment makes it possible, when simultaneously forming a MOS transistor and a bipolar transistor, to keep the emitter width of the bipolar transistor constant, to maintain the processing accuracy of the MOS transistor and to stabilize the diode current characteristics.

Processes for making a semiconductor device 100 as in FIG. 1 will now be explained.

Figures 2A, 2B:
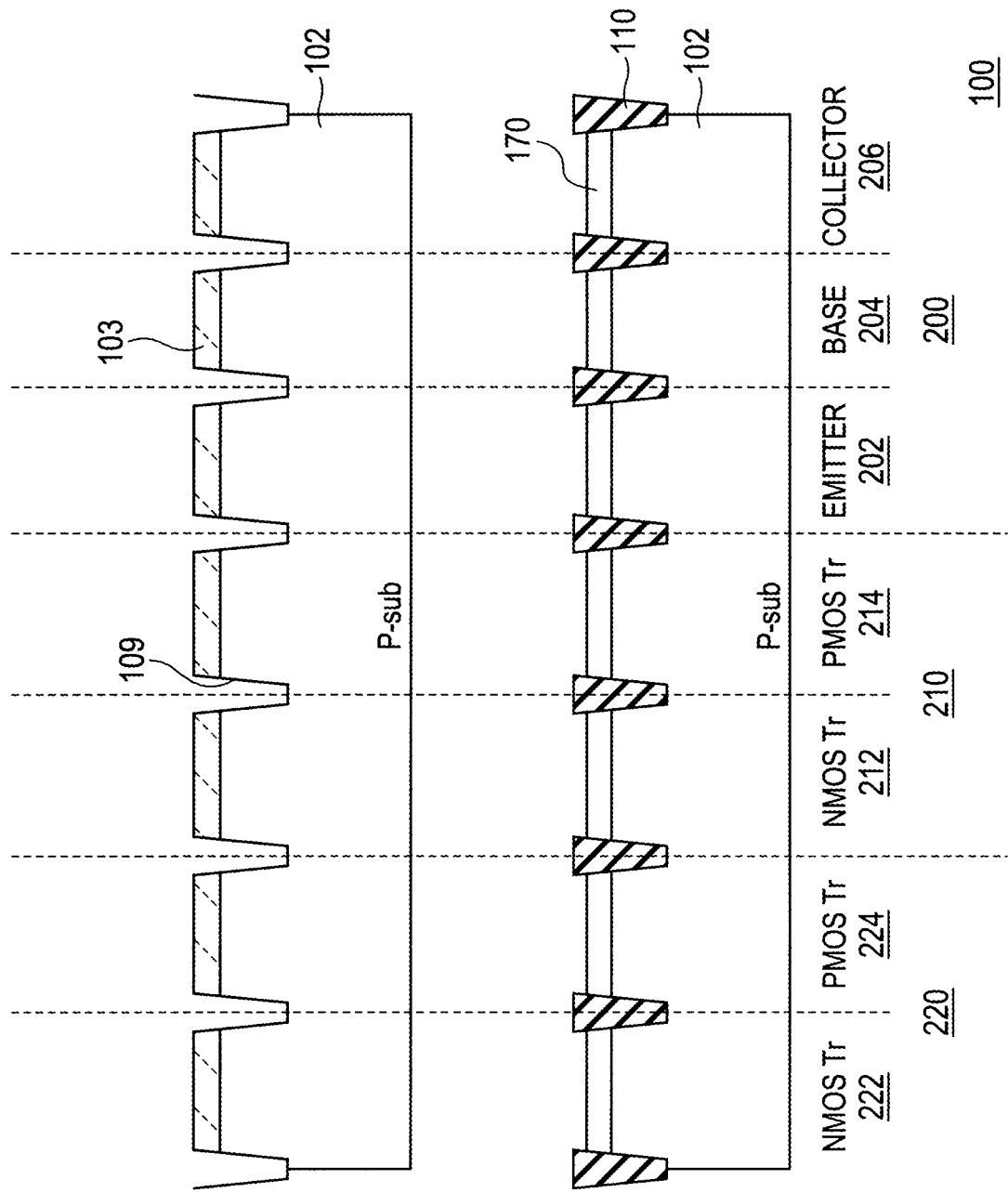
FIGS. 2A and 2B are sectional views illustrating steps in the process for manufacturing the semiconductor device of the embodiment of FIG. 1.

As shown in FIG. 2, first a device isolation film 110 is formed over the surface of a substrate 102. The device isolation film 110 can be based on STI (Shallow Trench Isolation). The device isolation film 110 is formed as follows: first, a cover film 103 comprising a silicon nitride film for example is formed over the surface of a substrate 102. Next, over the cover film 103, a resist film (not shown in the figures) is deposited selectively to define the location for device isolation film 110. Then, the cover film 103 is selectively removed by using the resist film as a mask. Thereafter, the resist film is removed and a trench 109 is formed over the surface of the substrate 102 by using the cover film 103 as a mask (FIG. 2A). Thereafter, an insulating film constituting the device isolation film 110 is embedded into the trench 109. Next, the insulating film exposed outside the trench is removed by chemical mechanical polishing (CMP) or the like. The device isolation film 110 can comprise a material having a sufficiently large etching selectivity relative to the cover film 103. The device isolation film 110 can comprise a silicon oxide film for example. Otherwise, the device isolation film 110 can also be configured by forming a liner film such as a silicon nitride film over a trench sidewall.

In the present embodiment, when the insulating film is removed by CMP, the polishing conditions of CMP are controlled so that the cover film 103 may be more liable to be polished than the device isolation film 110. Thereby it is possible to remove the cover film 103 and obtain a configuration where the height of the surface of the device isolation film 110 is higher than the height of the surface of the substrate 102 (FIG. 2B). Further, it is possible to control the difference between the height of the surface of the device isolation film 110 and the height of the surface of the substrate 102 to an intended value by controlling the quantities of the materials polished by CMP and the process of adjusting the height of the device isolation film 110 after the CMP. The difference between the height of the surface of the device isolation film 110 and the height of the surface of the substrate 102 can be controlled to an intended value so that the height of the surface of the device isolation film 100 may be not lower than the height of the surface of the substrate 102 in a bipolar transistor region 200 even after the surface of the device isolation film 110 is shaved in the succeeding processes such as a process of patterning a gate electrode and a gate insulating film, a process of etching back an insulating film for forming a sidewall (plural times when needed), and a process of patterning a silicide block film. The difference between the height of the surface of the device isolation film 110 and the height of the surface of the substrate 102 can be set at 5 to 60 nm for example.

Thereafter, an oxide film 170 is formed over the surface of the substrate 102 by thermal oxidation. The thickness of the oxide film 170 can be set at about 5 to 15 nm for example. The configuration shown in the FIGS. 2A and 2B is obtained through the processes described above.

Figure 3:
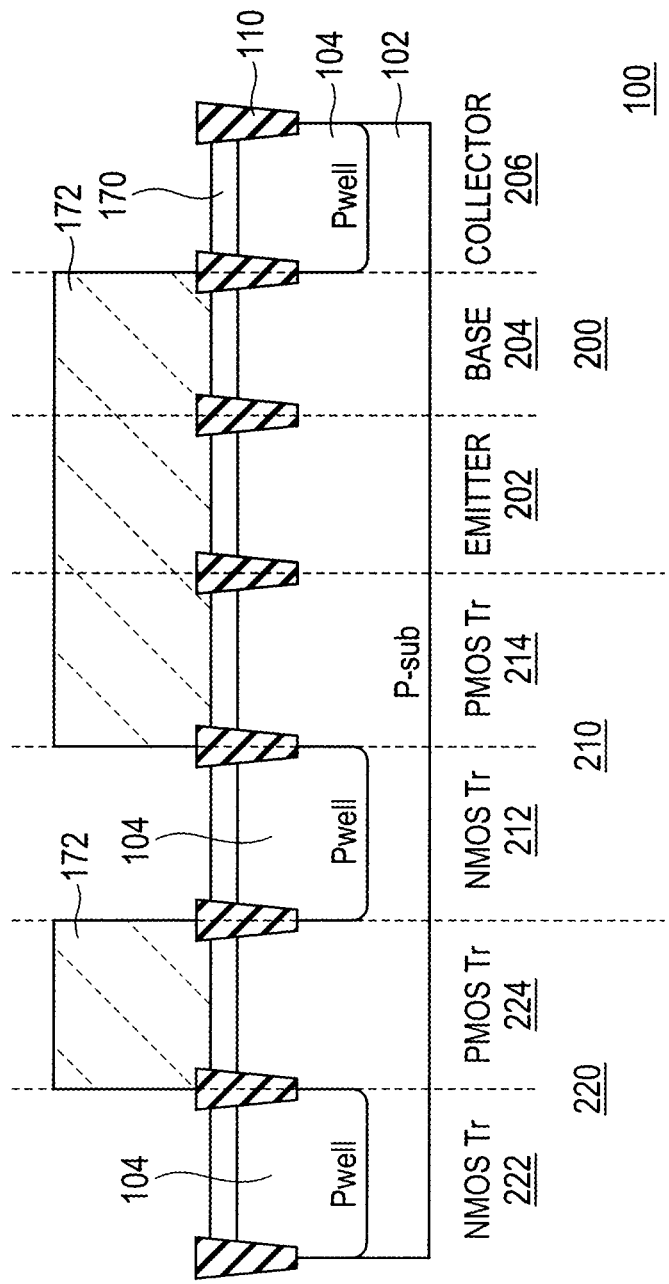
FIG. 3 is a sectional view illustrating steps following those of FIGS. 2A and 2B.

Subsequently, a P well 104 is formed by implanting P-type impurity ions into an NMOS region 222, an NMOS region 212, and a collector region 206 in the state where a PMOS region 224, a PMOS region 214, an emitter region 202, and a base region 204 are shielded with a resist film 172 (FIG. 3). Thereafter, the resist film 172 is removed.

Figure 4:
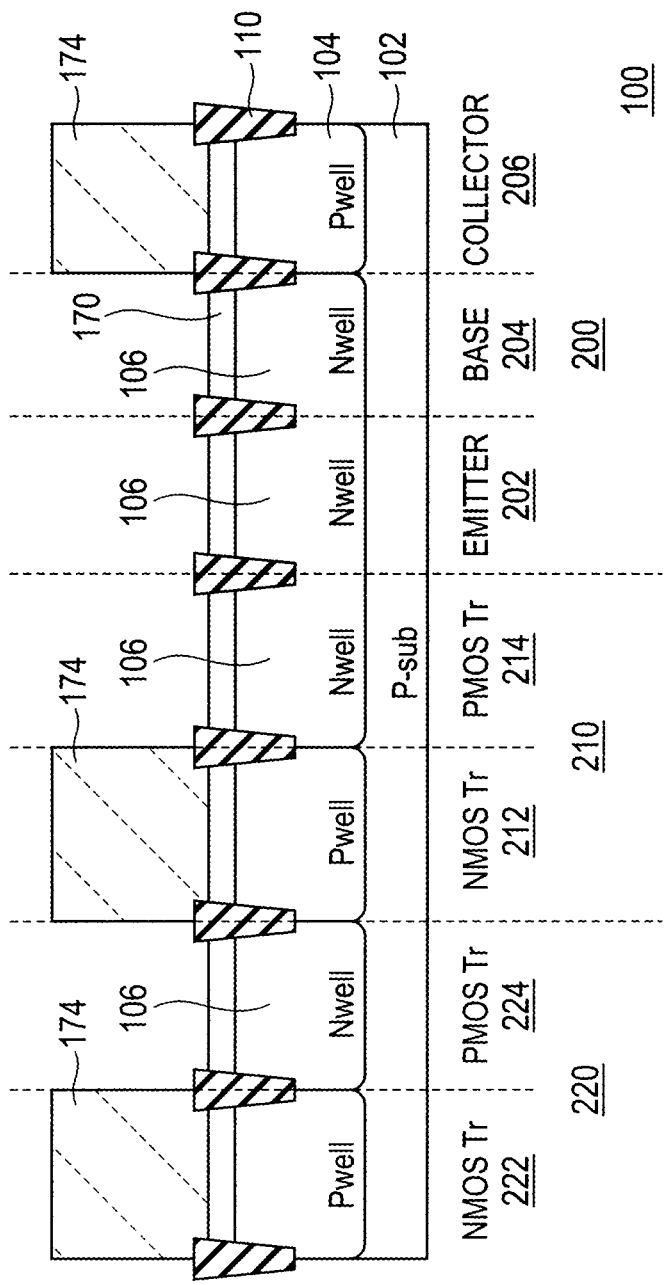
FIG. 4 is a sectional view illustrating steps following those of FIG. 3.

Next, an N well 106 is formed by implanting N-type impurity ions into the PMOS region 224, the PMOS region 214, the emitter region 202, and the base region 204 in the state where the NMOS region 222, the NMOS region 212, and the collector region 206 are shielded with a resist film 174 (FIG. 4). Thereafter, the resist film 174 is removed.

Figure 5:
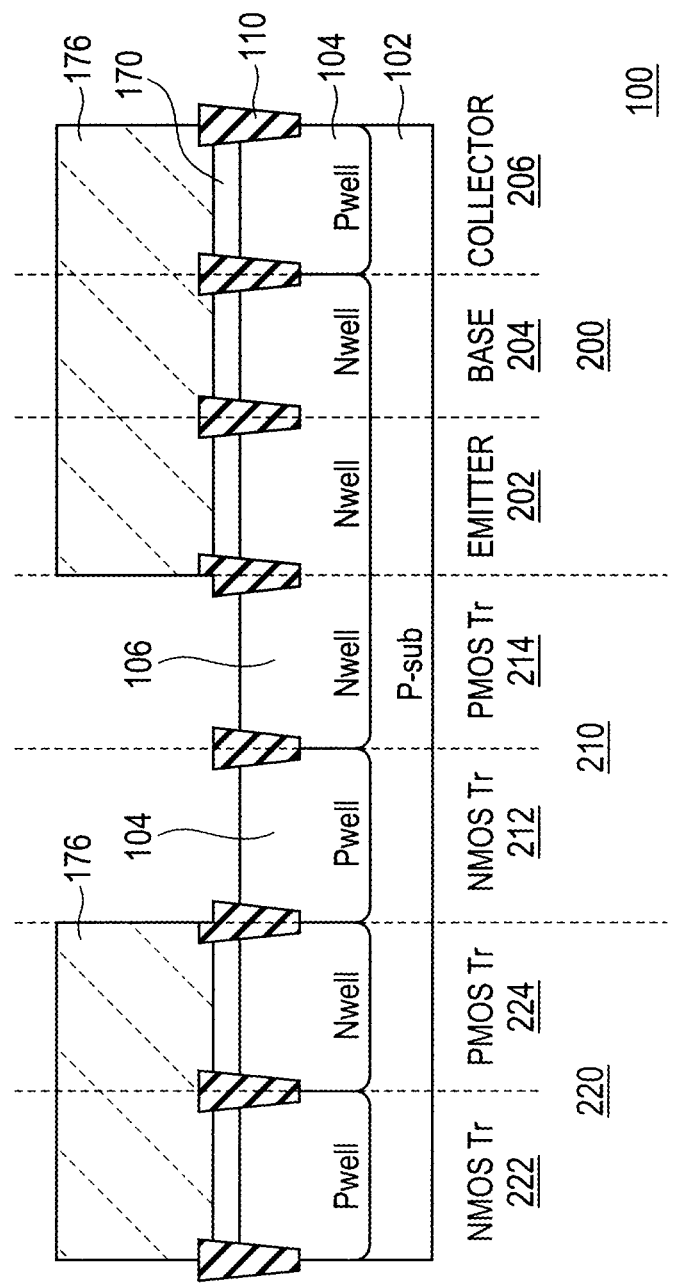
FIG. 5 is a sectional view illustrating steps following those of FIG. 4.
Figure 6:
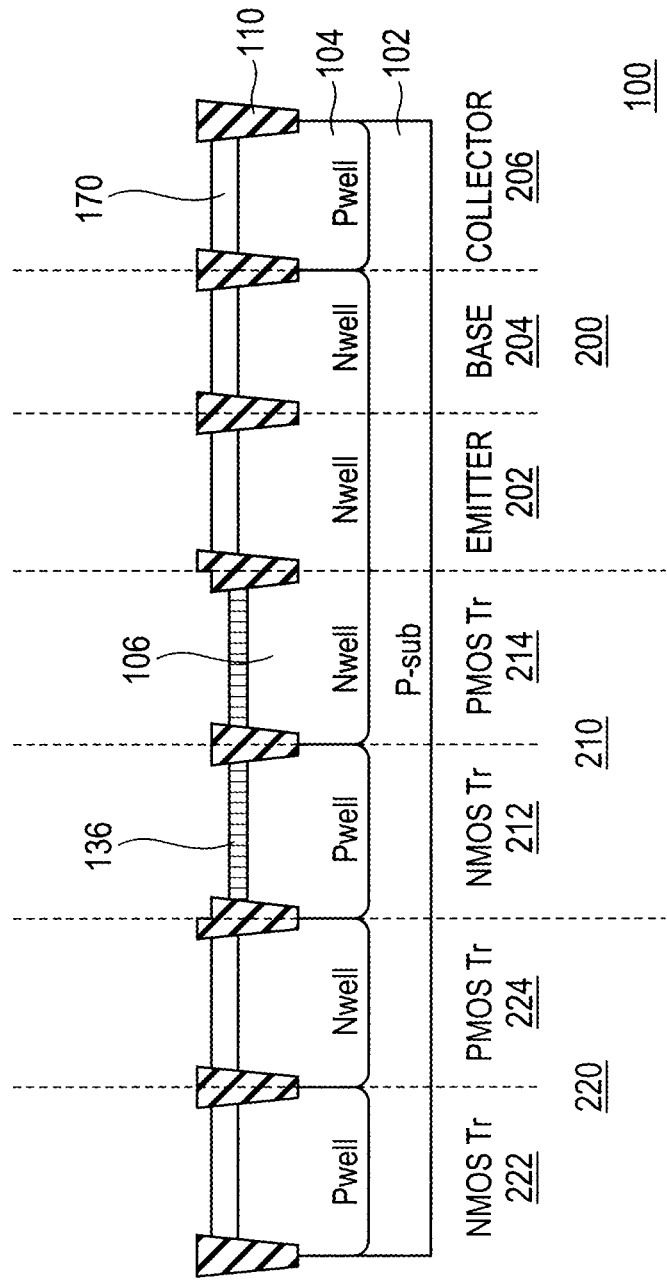
FIG. 6 is a sectional view illustrating steps following those of FIG. 5.

Subsequently, the regions other than an I/O region 210 are shielded with a resist film 176 and the oxide film 170 formed in the I/O region 210 is removed (FIG. 5). Thereafter, the resist film 176 is removed. Next, an insulating film that is to be a gate insulating film 136 is formed in the I/O region 210 (FIG. 6). The gate insulating film 136 can be formed by thermal oxidation. The thickness of the gate insulating film 136 can be set at about 5 to 8 nm for example.

Here, in the process of removing the oxide film 170 in the I/O region 210, a part of the device isolation film 110 in the I/O region 210 is also removed. In the present embodiment however, when the oxide film 170 in the I/O region 210 is removed, the resist film 176 is present over that part of the device isolation film 110 where it contacts the emitter region 202 and hence it is possible to avoid the thinning of the device isolation film 110 touching the emitter region 202.

Figure 7:
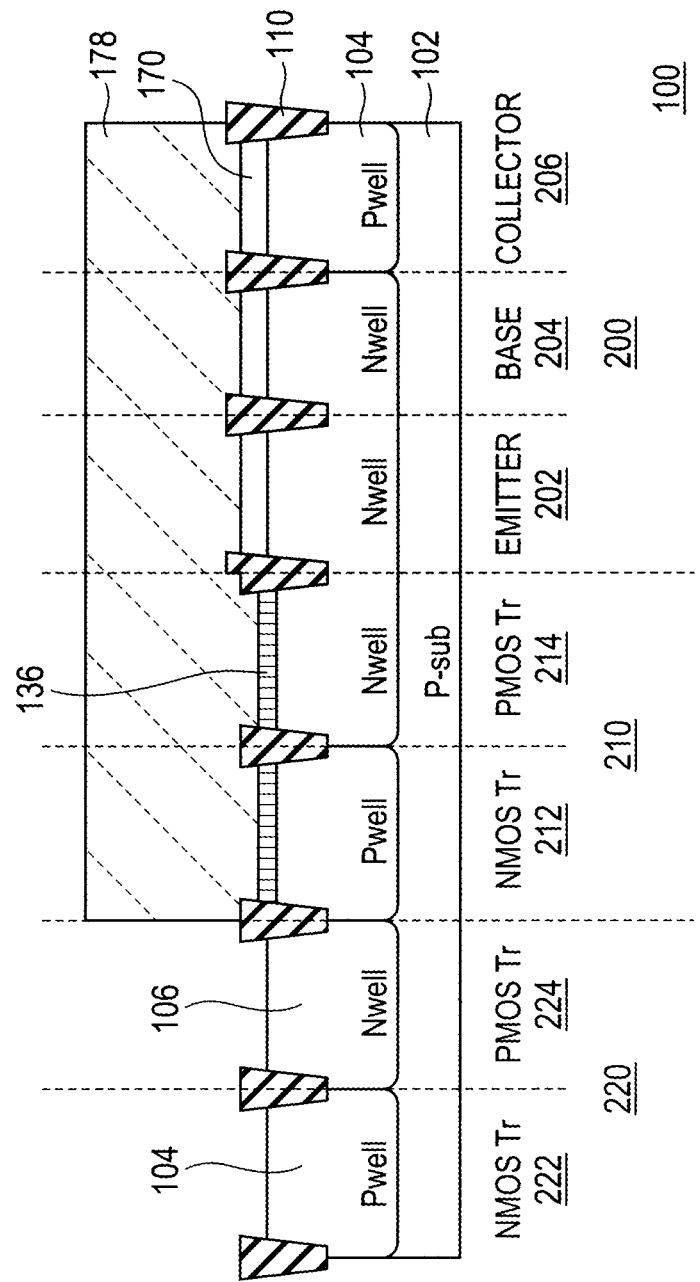
FIG. 7 is a sectional view illustrating steps following those of FIG. 6.
Figure 8:
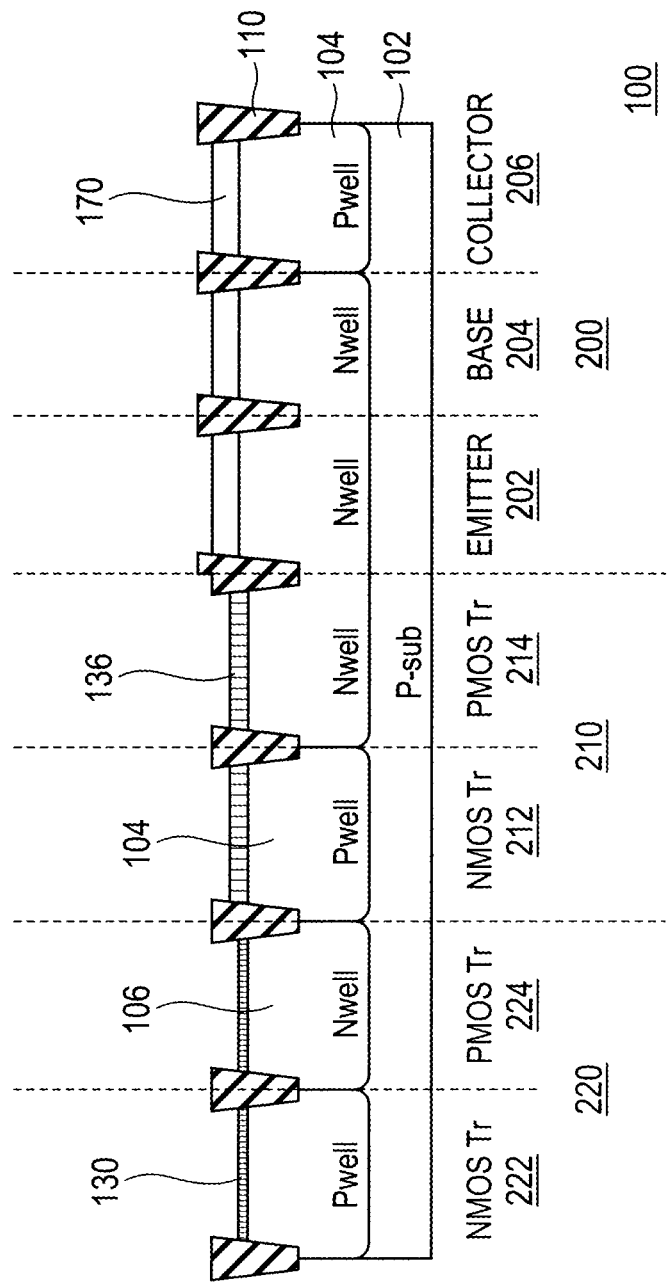
FIG. 8 is a sectional view illustrating steps following those of FIG. 7.

Subsequently, the regions other than the core MOS transistor region 220 are shielded with a resist film 178 and the oxide film 170 formed in the core MOS transistor region 220 is removed (FIG. 7). Thereafter, the resist film 178 is removed. Next, an insulating film that is to be a gate insulating film 130 is formed in the core MOS transistor region 220 (FIG. 8). Here, the gate insulating film 130 can be configured so as to be thinner than the gate insulating film 136. The gate insulating film 130 can be formed by thermal oxidation. Further, the thickness of the gate insulating film 130 can be set at about 1 to 3 nm for example.

Here, in the process of removing the oxide film 170 in the core MOS transistor region 220, a part of the device isolation film 110 in the core MOS transistor region 220 is also removed. In the present embodiment however, when the oxide film 170 in the core MOS transistor region 220 is removed, the resist film 178 is present over those parts of device isolation films 110 that contact the emitter region 202 and hence it is possible to avoid the thinning of the device isolation film 110 touching the emitter region 202.

Through the above processes, the height of the device isolation film 110 in the bipolar transistor region 200 from the substrate surface can be set so as to be higher than the height of the device isolation film 110 in the core MOS transistor region 220 and the I/O region 210 from the substrate surface. For example, at least the device isolation film 110 in the emitter region 202 of the bipolar transistor region 200 can be configured so as to be higher than the device isolation film 110 in the I/O region 210 and the core MOS transistor region 220 by about 5 to 50 nm (50 to 500 Å).

Figure 9:
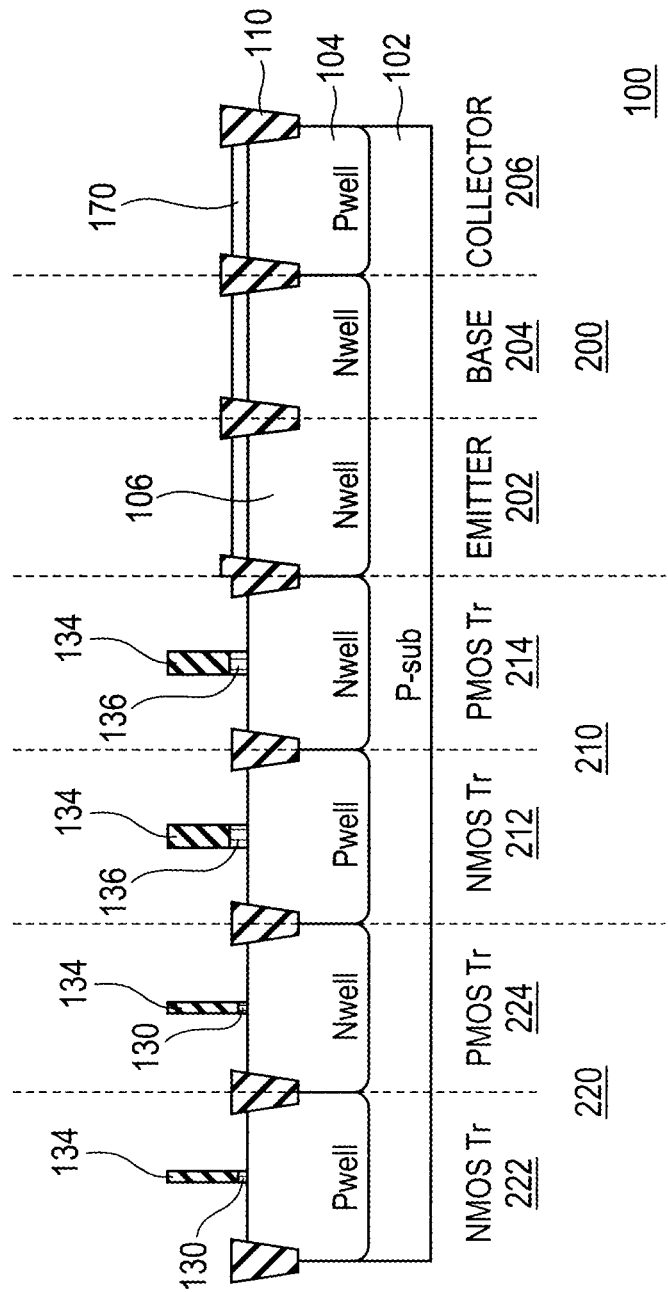
FIG. 9 is a sectional view illustrating steps following those of FIG. 8.

In the state, a conductive film constituting a gate electrode is formed over the whole surface of the substrate 102. Next, the conductive film constituting the gate electrode, the gate insulating film 130, and the gate insulating film 136 are patterned into the shape of a gate. As a result, gate electrodes 134 are formed in the core MOS transistor region 220 and the I/O region 210. The conductive film is removed in the bipolar transistor region 200, (FIG. 9). Further on this occasion, although the oxide film 170 and the device isolation film 110 are shaved slightly (film thickness of about 0 to 3 nm for example), the height of the surface of the device isolation film 110 is set so as to be higher to a prescribed extent than the height of the surface of the substrate 102 in consideration of such film thinning in the process shown in FIGS. 2A and 2B and hence it is possible to set the height of the surface of the device isolation film 110 so as to be higher than the height of the surface of the substrate 102 in the bipolar transistor region 200 in the succeeding processes too.

Thereafter, in the core MOS transistor region 220 and the I/O region 210, impurity ions are implanted by using the gate electrodes as masks in order to form extension regions (not shown in the figures). For example, firstly, impurity ions are implanted into the NMOS region 222 and the NMOS region 212 in the state where the bipolar transistor region 200, the PMOS region 224, and the PMOS region 214 are shielded with a resist film and the resist film is removed. Next, impurity ions are implanted into the PMOS region 224 and the PMOS region 214 in the state where the bipolar transistor region 200, the NMOS region 222, and the NMOS region 212 are shielded with a resist film and the resist film is removed.

Figure 10:
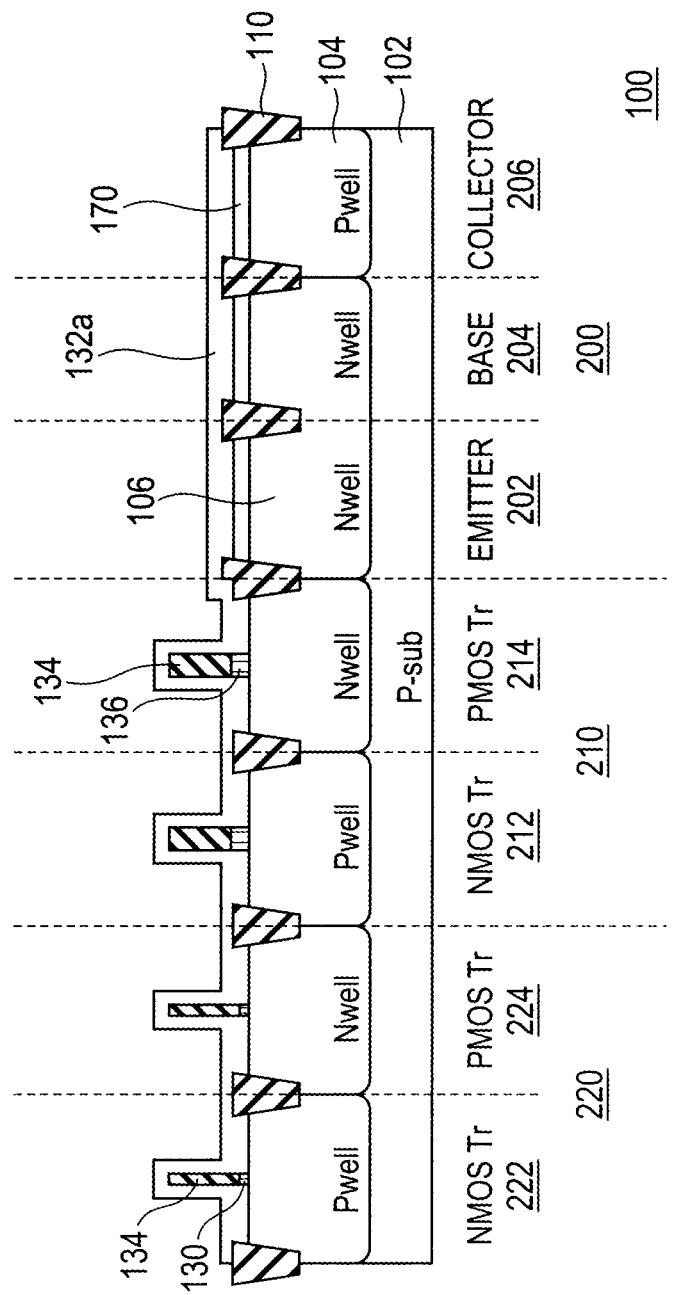
FIG. 10 is a sectional view illustrating steps following those of FIG. 9.
Figure 11:
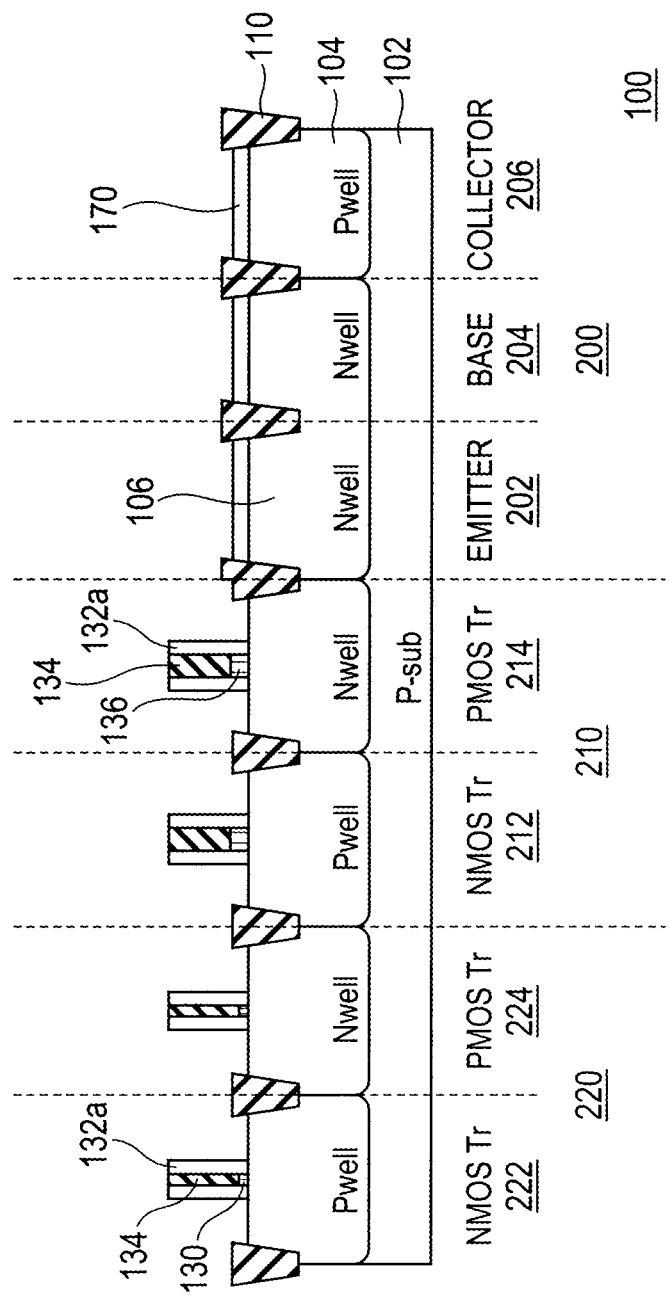
FIG. 11 is a sectional view illustrating steps following those of FIG. 10.

Subsequently, a sidewall insulating film 132a that is to be an offset spacer is formed over the whole surface of the substrate 102 (FIG. 10). The sidewall insulating film 132a can comprise, for example, a silicon oxide film or a silicon nitride film (film thickness of about 3 to 20 nm for example). Thereafter, the sidewall insulating film 132a is etched back and patterned into a prescribed shape (FIG. 11). The sidewall insulating film 132a is removed in the bipolar transistor region 200. Further on this occasion, although the oxide film 170 and the device isolation film 110 are shaved slightly (about 0 to 3 nm for example), the height of the surface of the device isolation film 110 is set so as to be higher to a prescribed extent than the height of the surface of the substrate 102 in consideration of such film thinning in the process shown in FIGS. 2A and 2B and hence it is possible to set the height of the surface of the device isolation film 110 so as to be higher than the height of the surface of the substrate 102 in the bipolar transistor region 200 in the succeeding processes too.

Figure 12:
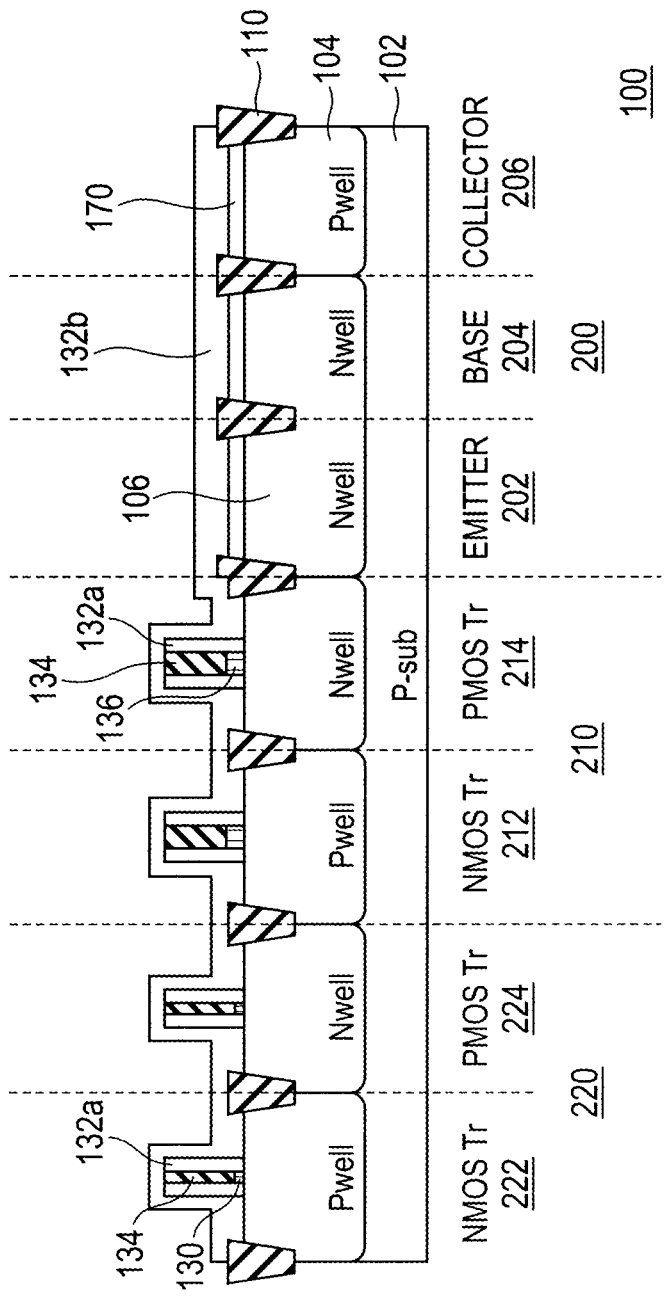
FIG. 12 is a sectional view illustrating steps following those of FIG. 11.
Figure 13:
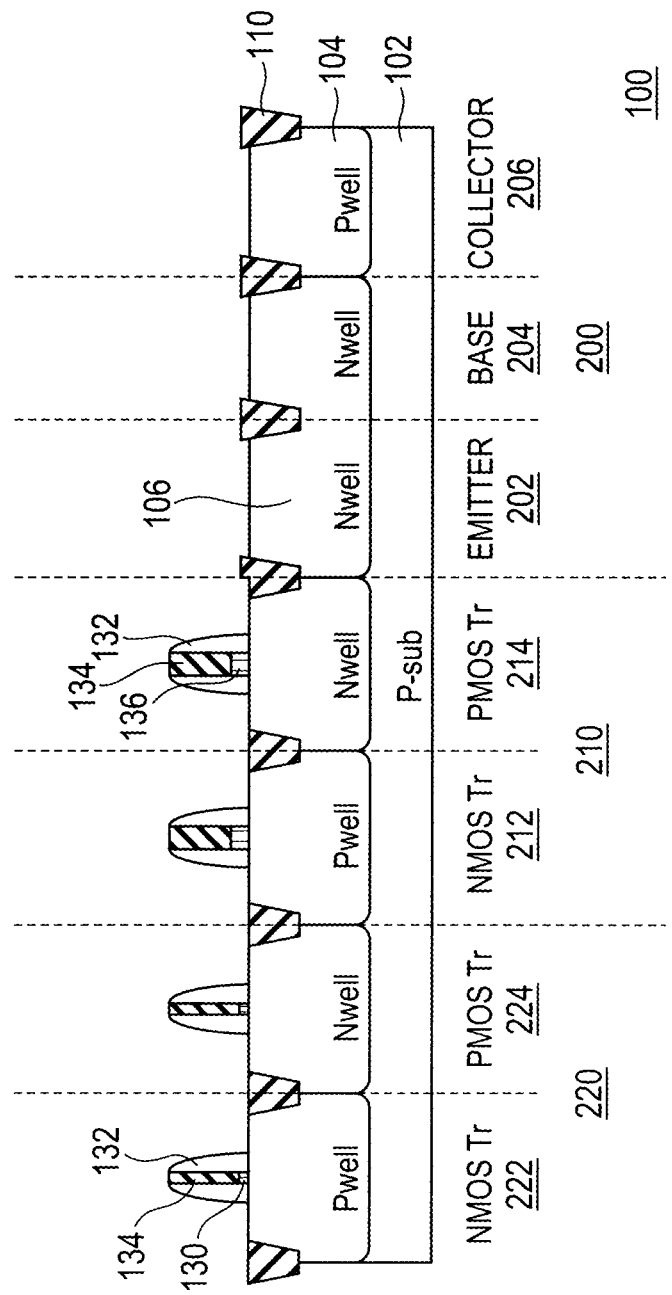
FIG. 13 is a sectional view illustrating steps following those of FIG. 12.

Next, a sidewall insulating film 132b is formed over the whole surface of the substrate 102 (FIG. 12). The sidewall insulating film 132b can comprise, for example, a silicon oxide film or a silicon nitride film (film thickness of about 10 to 50 nm for example). Thereafter, the sidewall insulating film 132b is etched back and patterned into a prescribed shape. The sidewall insulating film 132b is removed in the bipolar transistor region 200. Further, the oxide film 170 is also removed in the bipolar transistor region 200 (FIG. 13). Here in FIG. 13, the sidewall insulating film 132a and the sidewall insulating film 132b are shown collectively as a sidewall 132. Further on this occasion, although the device isolation film 110 is also shaved slightly (film thickness of about 0 to 20 nm for example), the height of the surface of the device isolation film 110 is set so as to be higher to a prescribed extent than the height of the surface of the substrate 102 in consideration of such film thinning in the process shown in FIGS. 2A and 2B and hence it is possible to set the height of the surface of the device isolation film 110 so as to be higher than the height of the surface of the substrate 102 in the bipolar transistor region 200 also in the succeeding processes.

Figure 14:
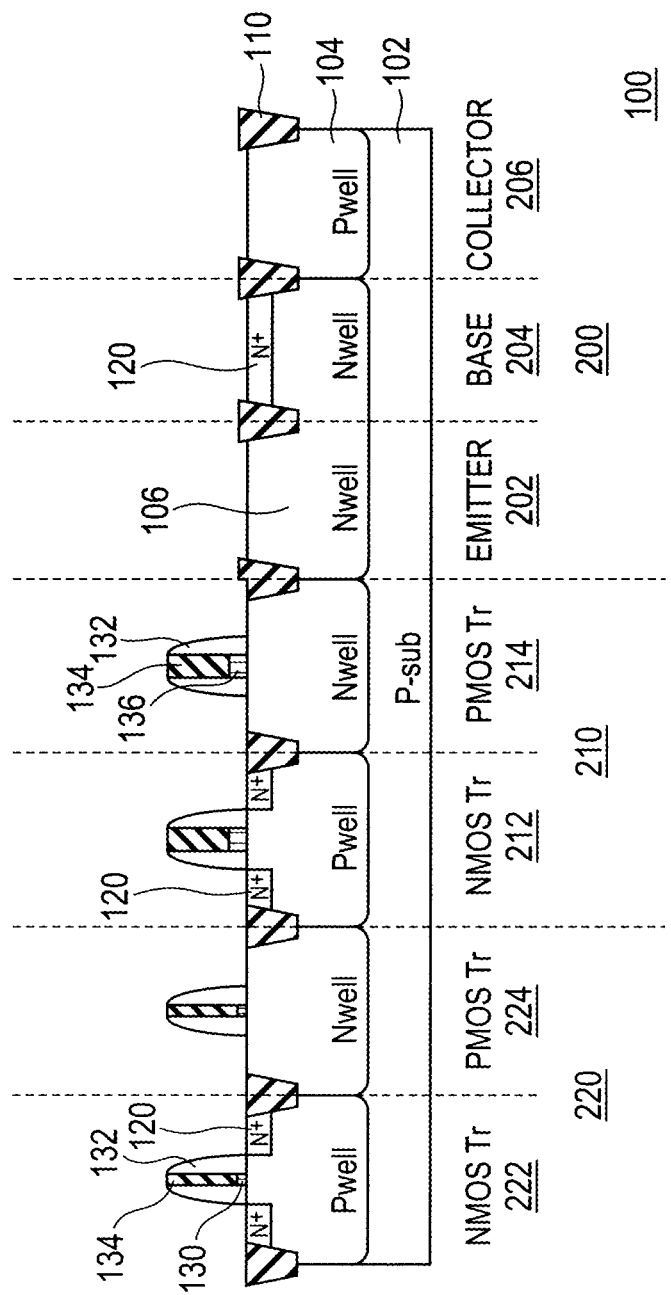
FIG. 14 is a sectional view illustrating steps following those of FIG. 13.

Thereafter, impurity ions are implanted into regions in order to form an n-doped region 120 and a p-doped region 122. For example, firstly the process of implanting impurity ions into the NMOS region 222, the NMOS region 212, the base region 204, and the collector region 206 is applied in the state where the PMOS region 224, the PMOS region 214, and the emitter region 202 are shielded with a resist film and an n-doped region 120 is formed in those regions. Thereafter, the resist film is removed (FIG. 14).

Figure 15:
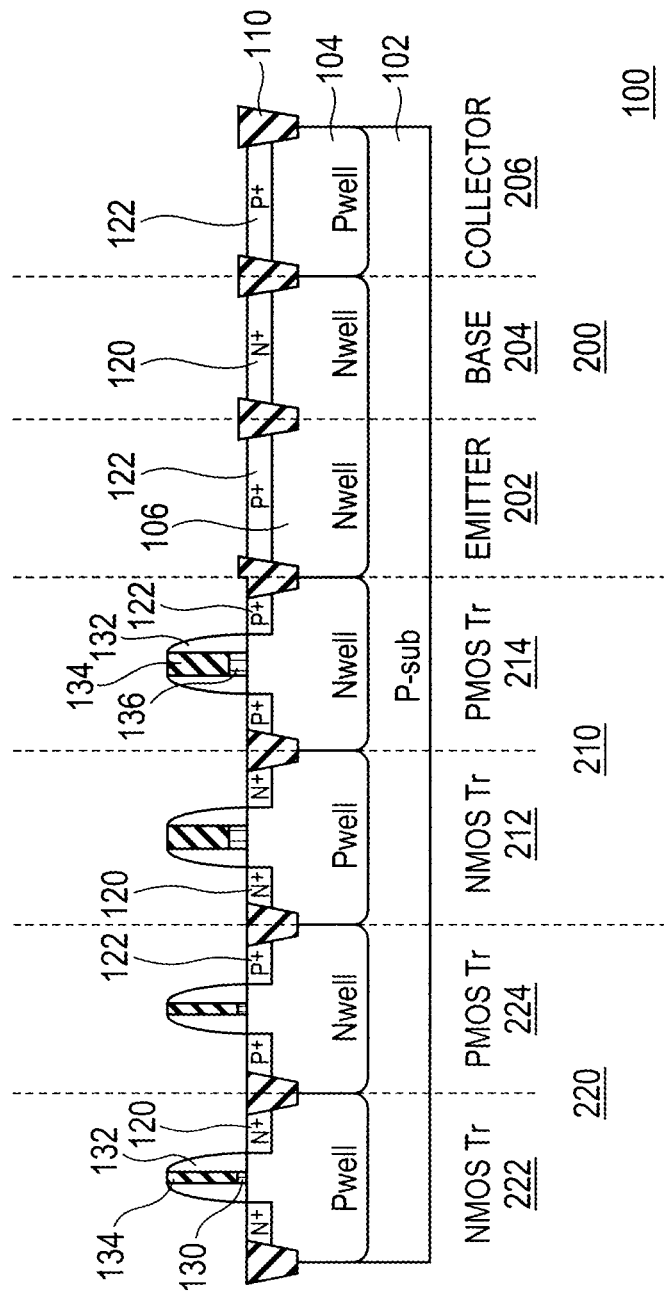
FIG. 15 is a sectional view illustrating steps following those of FIG. 14.

Next, the process of implanting impurity ions into the PMOS region 224, the PMOS region 214, and the emitter region 202 is applied in the state where the NMOS region 222, the NMOS region 212, the base region 204, and the collector region 206 are shielded with a resist film and a p-doped region 122 is formed in those regions. Thereafter, the resist film is removed (FIG. 15).

Figure 16:
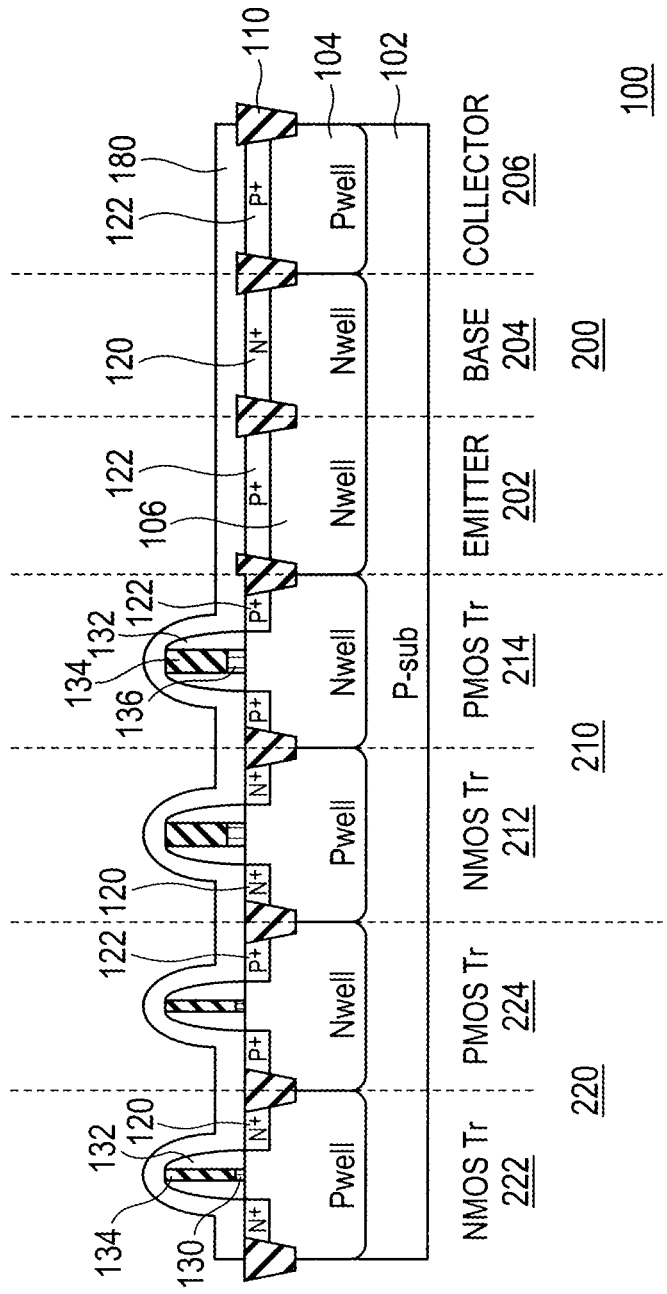
FIG. 16 is a sectional view illustrating steps following those of FIG. 15.
Figure 17:
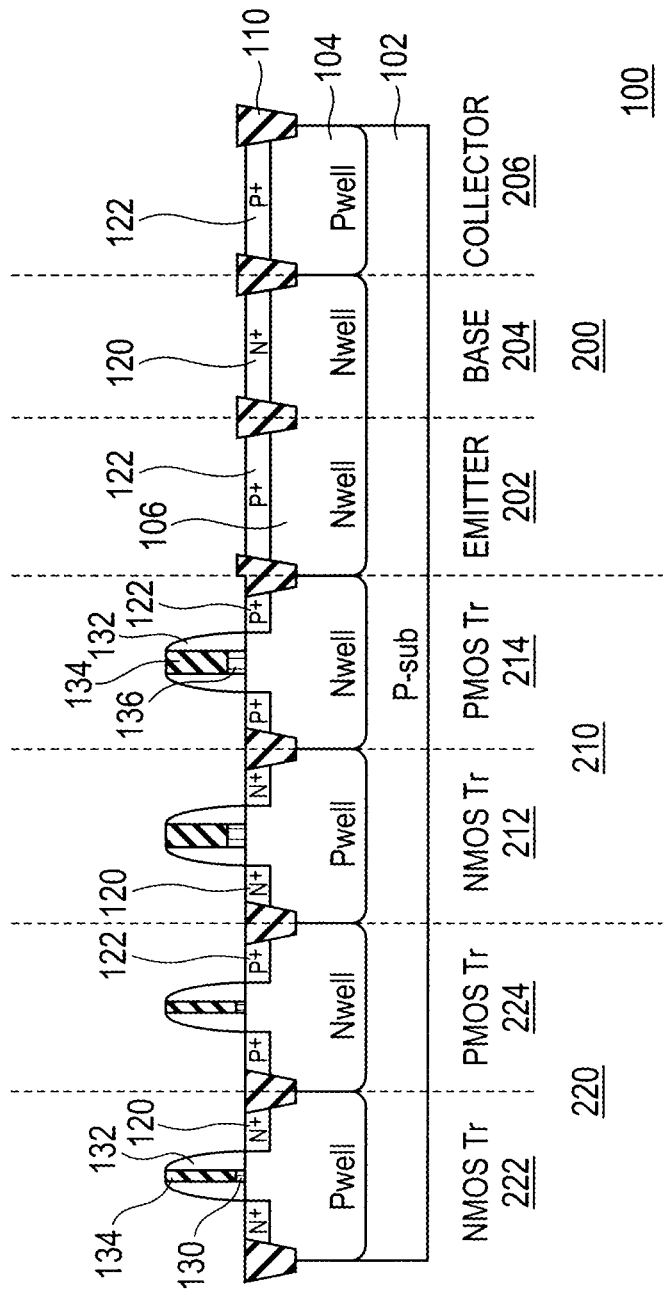
FIG. 17 is a sectional view illustrating steps following those of FIG. 16.

Next, a silicide block film 180 is formed over the whole surface of the substrate 102 (FIG. 16). The silicide block film 180 can comprise, for example, a silicon oxide film (film thickness of about 5 to 50 nm for example). Thereafter, the silicide block film 180 only in the region where the silicide block film 180 is used as a silicide block resistor is left and the silicide block film 180 in other regions is removed (FIG. 17). In the present embodiment, the silicide block film 180 is removed also in the emitter region 202, the base region 202, and the collector region 206. Further on this occasion, although the device isolation film 110 is also shaved slightly (film thickness of about 0 to 30 nm for example), the height of the surface of the device isolation film 110 is set so as to be higher to a prescribed extent than the height of the surface of the substrate 102 in consideration of such film thinning in the process shown in FIGS. 2A and 2B and hence it is possible to set the height of the surface of the device isolation film 110 so as to be higher than the height of the surface of the substrate 102 in the bipolar transistor region 200 also in the succeeding processes.

Figure 18:
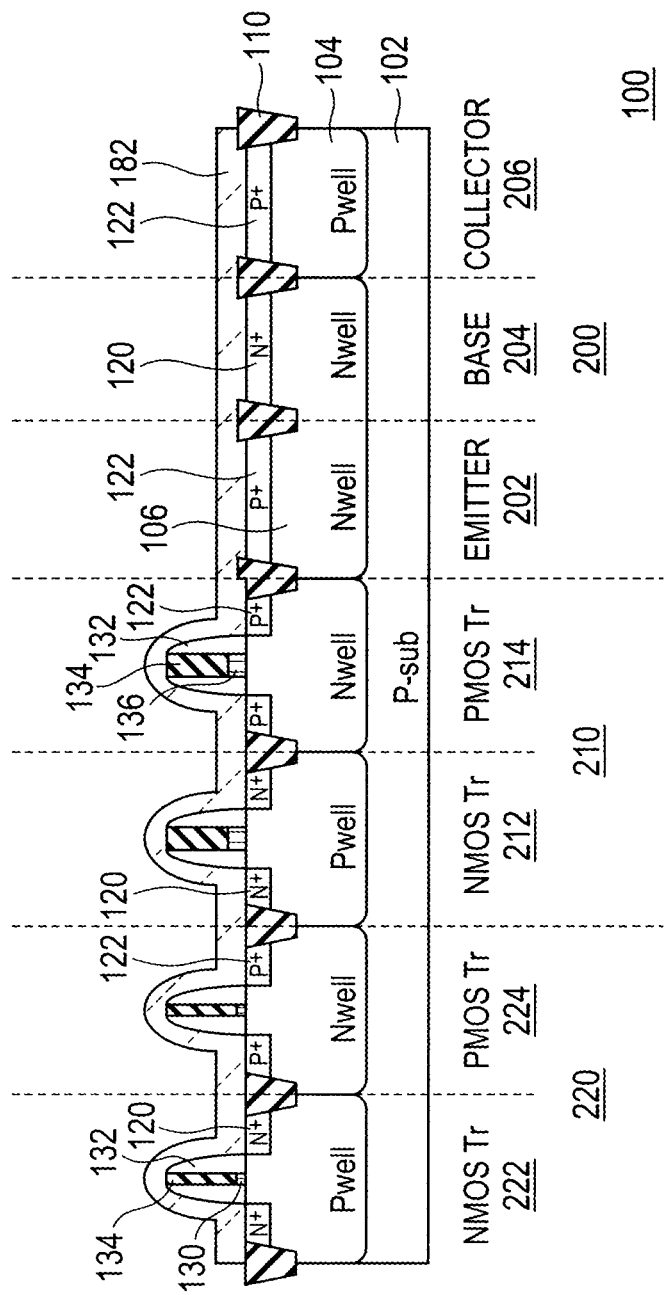
FIG. 18 is a sectional view illustrating steps following those of FIG. 17.

Next, a metal film 182 is formed over the whole surface of the substrate 102 (FIG. 18). The metal film 182 may comprise Co, Ni, or Pt, for example. By so doing, at a site where the metal film 182 touches a diffusion layer over the surface of the substrate 102, the metal film 182 reacts with the substrate 102 and a silicide layer 124 is formed. By so doing, a semiconductor device 100 having the configuration shown in FIG. 1 is obtained. In the present embodiment, in the bipolar transistor region 200 too, by forming the silicide layer 124 over the substrate surface, it is possible to inhibit a contact from penetrating into the diffusion layer when etching is applied during contact forming. Further, it is possible to lower the resistance of the bipolar transistor 150 and charge an electric field uniformly.

In the present embodiment, the height of the surface of the device isolation film 110 at a site where the device isolation film 110 touches the emitter region 202 is not lower than the height of the surface of the substrate 102 in the emitter region 202. Consequently, as shown in FIGS. 21A and 21B, and 22A and 22B, it is possible to prevent silicide layer 124 from sagging at the end of the emitter region 202 and control the relationship between the silicide layer 124 and a junction depth to a constant state. By so doing, it is possible to stabilize an emitter width and stabilize the diode current characteristics.

In a MOS transistor region, a gate electrode is formed not only over a diffusion layer over the surface of a substrate 102 but also over a device isolation film 110. Consequently, it is preferable that the difference between the height of the surface of the substrate 102 and the height of the surface of the device isolation film 110 is small in order to maintain gate processing accuracy when lithography is applied during gate forming. In the present embodiment, the height of the surface of a device isolation film 110 at a site where the device isolation film 110 touches an I/O region 210 and a core MOS transistor region 220 that are a MOS transistor region is set so as to be lower than the height of the surface of the device isolation film 110 at a site where the device isolation film 110 touches an emitter region 202. As a result, it is possible to: reduce the difference between the height of the surface of a substrate 102 and the height of the surface of the device isolation film 110; and maintain gate processing accuracy.

Although embodiments according to the present invention have heretofore been described with reference to the drawings, those are exemplifications of the present invention and various configurations other than the aforementioned configurations can also be adopted.

For example, a semiconductor device 100 can be formed through the following procedures.

Figure 19:
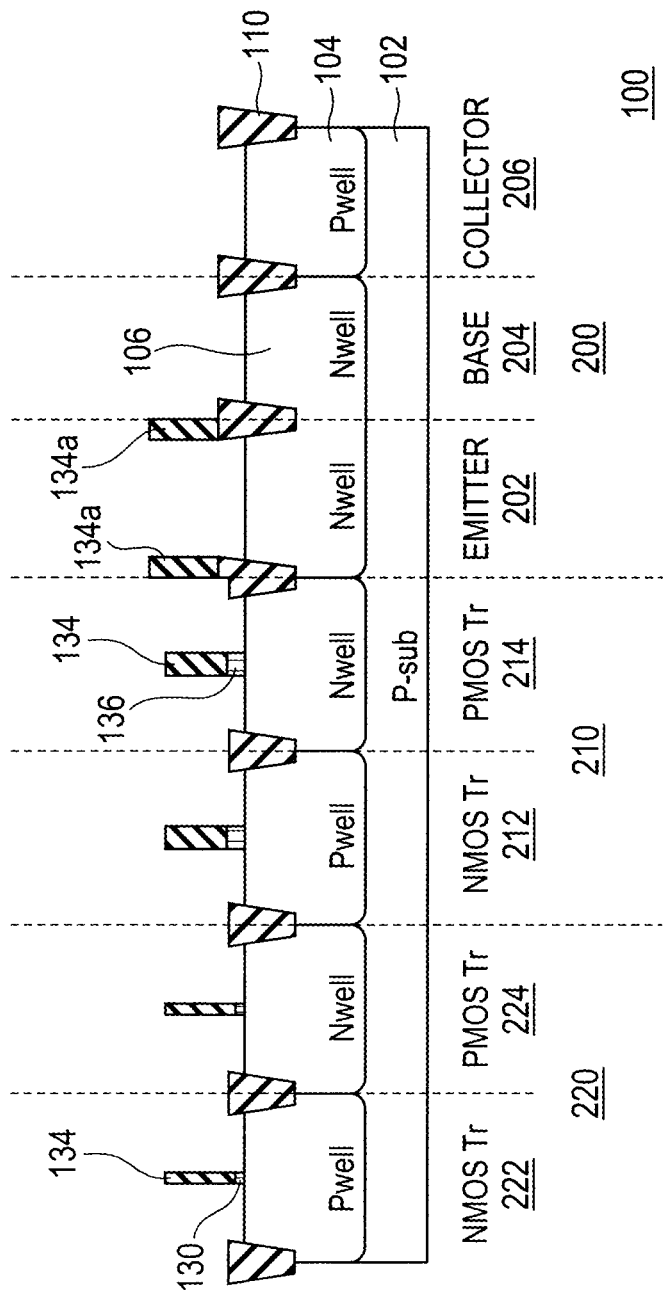
FIG. 19 is a sectional view illustrating steps of an alternative embodiment of a process for manufacturing a semiconductor device according to the invention.
Figure 21A:
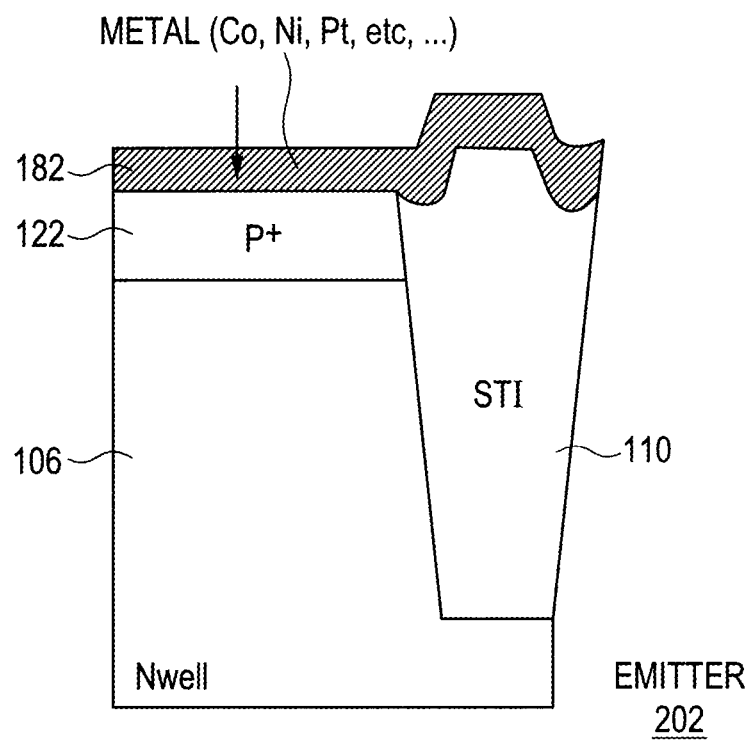
FIGS. 21A and 21B illustrate advantageous structural differences that can be achieved by embodiments of the present invention.
Figure 21B:
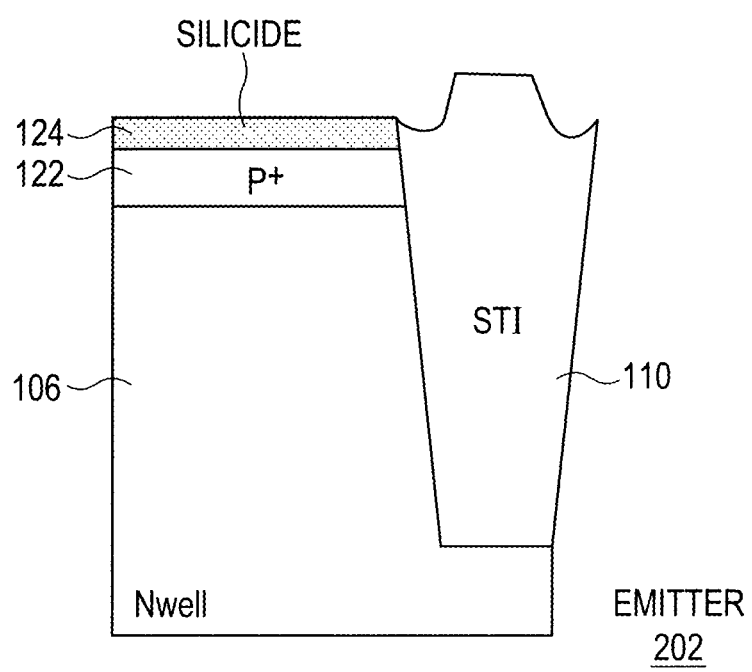
Figure 22A:
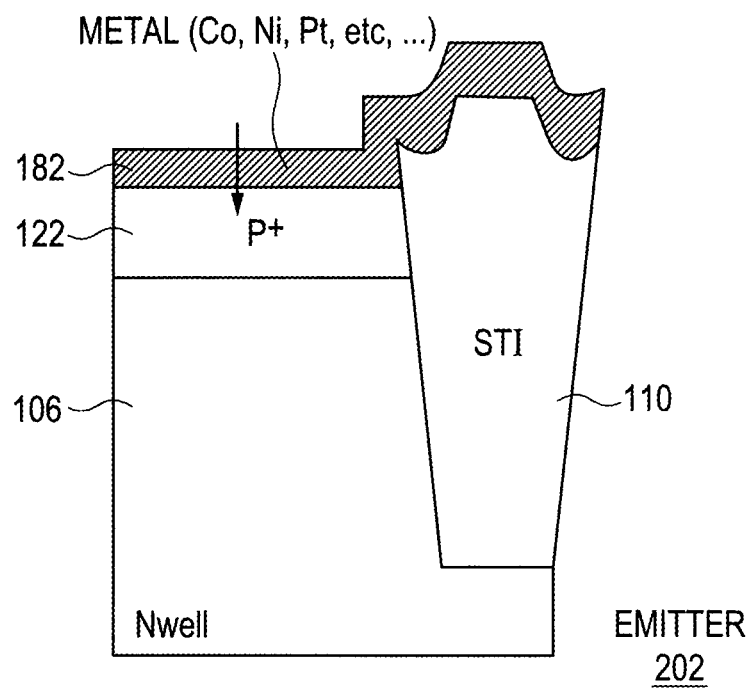
FIGS. 22A and 22B further illustrate advantageous structural differences that can be achieved by embodiments of the present invention.
Figure 22B:
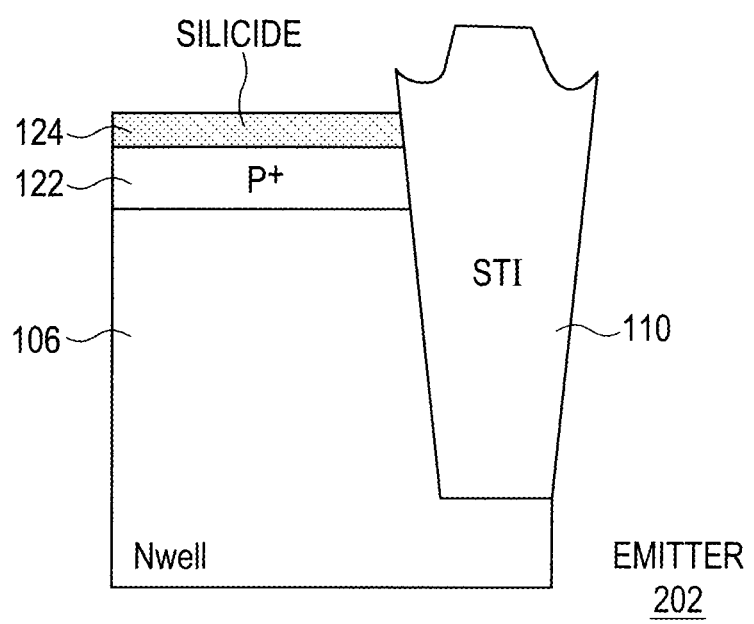
Figure 23A:
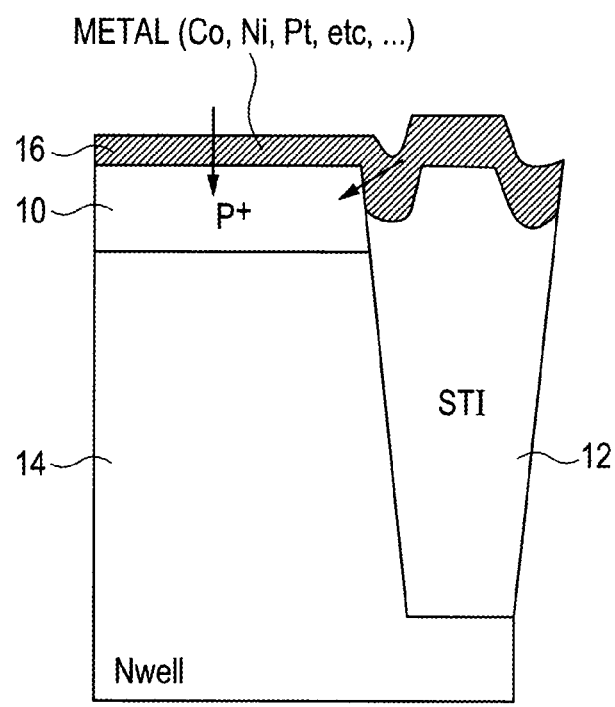
FIGS. 23A and 23B illustrate disadvantages of the prior art whose discovery contributed to the present invention.
Figure 23B:
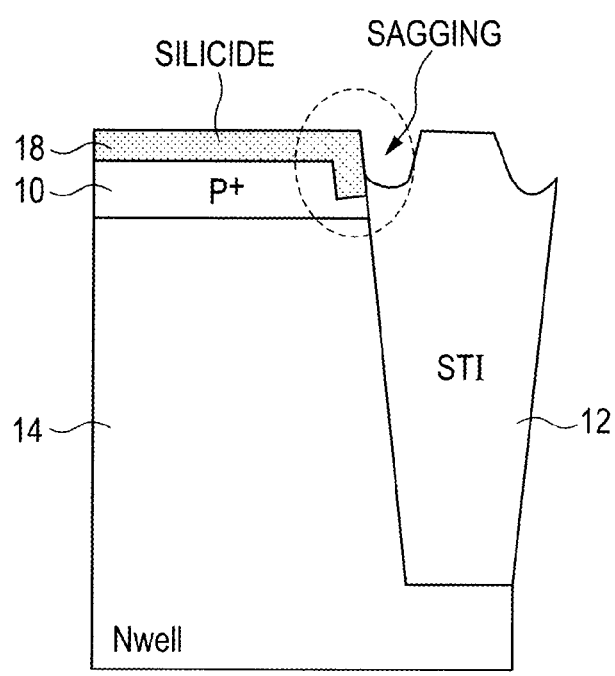

For example, when the gate electrode 134 explained in reference to FIG. 9 is patterned, it is possible to selectively leave a conductive film (a gate electrode film 134a) at the end of a device isolation film 110 at a site where the device isolation film 110 touches an emitter region 202 of a bipolar transistor region 200 (FIG. 19). By so doing, it is possible to avoid the thinning of the device isolation film 110 touching the emitter region 202 in the succeeding processes.

Further, for example, when a silicide block film 180 is removed, it is possible to: shield the upper part of the end of a device isolation film 110 at a site where the device isolation film 110 touches an emitter region 202 of a bipolar transistor region 200 with a resist film 184 (FIG. 20A); and selectively leave the silicide block film 180 at the site (FIG. 20B). By so doing, it is possible to: increase the height of an insulating film at a site where the device isolation film 110 touches the emitter region 202; and avoid the thinning of the device isolation film 110 touching the emitter region 202 in the succeeding processes.

Furthermore, in the above embodiments, the configuration where, over the whole surface of a bipolar transistor region 200, the height of the surface of a device isolation film 110 is set so as to be higher than the height of the surface thereof at a site where the device isolation film 110 touches an I/O region 210 and a core MOS transistor region 220 is shown. It is also possible however to configure a device isolation film 110 so that at least the height of the surface of the device isolation film 110 at a site where the device isolation film 110 touches an emitter region 202 may not be lower than the height of the surface of a substrate 102 in the emitter region 202 and may be higher than the height of the surfaces of other regions. On this occasion, in the process of removing an oxide film 170 explained in reference to FIG. 5 or the process of removing an oxide film 170 explained in reference to FIG. 7 for example, it is possible to adopt a configuration where a base region 204 and a collector region 206 of a bipolar transistor region 200 are not shielded with a resist film 176 and a resist film 178, respectively.

A preferred method for producing a semiconductor device as described herein comprises forming a device isolation film for separating regions over a substrate having a MOS transistor region and a bipolar transistor region including an emitter region, a base region, and a collector region so that the height of the surface of the device isolation film may be higher than the height of the surface of the substrate; forming an insulating film over the whole surface of the substrate; removing the insulating film in the MOS transistor region while at least shielding, with a mask, the device isolation film at a site where the device isolation film touches the emitter region of the bipolar transistor region; forming a gate insulating film over the surface of the substrate in the MOS transistor region; forming a conductive film comprised of a gate electrode over the gate insulating film to form the gate electrode; forming a sidewall on the side of the gate electrode; forming a silicide layer over a source/drain region of the MOS transistor region and over the emitter region, the base region, and the collector region of the bipolar transistor region; wherein, in the step of forming the silicide layer, the device isolation film for separating the bipolar transistor region and the MOS transistor region from each other is formed higher than the surface of the substrate at the bipolar transistor side.

While the present invention has been described in connection with various preferred embodiments thereof, it is to be understood that those embodiments are provided merely to illustrate the invention, and should not be used as a pretext to limit the scope of protection conferred by the true scope and spirit of the appended claims.

What is claimed is:

1. A semiconductor device comprising:
   a substrate having a MOS transistor region and a bipolar transistor region; and
   a device isolation film separating the MOS transistor region from the bipolar transistor region;
   wherein said bipolar transistor region comprises a silicide film contacting said device isolation film at one side thereof, and wherein said device isolation film is taller at said one side than another side thereof.

2. A semiconductor device comprising:
   a substrate having a MOS transistor region and a bipolar transistor region; and
   a device isolation film separating the MOS transistor region from the bipolar transistor region;
   wherein said device isolation film projects upwardly from said substrate at a part thereof contacting said bipolar transistor region, and
   wherein the bipolar transistor region comprises an emitter region contacting the device isolation film.

3. The semiconductor device according to claim 1, wherein said device isolation film is taller at a part thereof contacting said bipolar transistor region than at a part thereof contacting said MOS transistor region.

4. The semiconductor device according to claim 1, wherein the substrate is of a first conductivity type,
   wherein the bipolar transistor region comprises an emitter region including a second conductivity type well and a first conductivity type diffusion region formed in the second conductivity type well, a base region including a second conductivity type well and a second conductivity type diffusion region formed in the second conductivity type well, and a collector region including a first conductivity type well and a first conductivity type diffusion region formed in the first conductivity type well.

5. The semiconductor device according to claim 4, wherein the first conductivity type is P type.

6. The semiconductor device according to claim 1, wherein a plurality of MOS transistors having gate insulating films of different thicknesses are formed in the MOS transistor region.

7. The semiconductor device according to claim 1, wherein a CMOS transistor including a PMOS transistor and an NMOS transistor is formed in the MOS transistor region.

8. The semiconductor device according to claim 1, wherein a conductive film comprised of a material identical to a material comprised of a gate electrode of the MOS transistor is formed over the device isolation film for separating the bipolar transistor region and the MOS transistor region from each other.

9. The semiconductor device according to claim 1, wherein an insulating film functioning as a silicide block film is formed over the device isolation film.

10. A semiconductor device comprising:
    a substrate having a MOS transistor region and a bipolar transistor region; and
    a device isolation film separating the MOS transistor region from the bipolar transistor region;
    wherein said MOS transistor region comprises a first silicide film contacting said device isolation film at one side thereof, and said bipolar transistor region comprises a second silicide film contacting said device isolation film at an opposite side thereof;
    said first silicide film having a greater depth in a portion thereof contacting said device isolation film and a shallower depth in a portion thereof not contacting said device isolation film; and
    said second silicide film having a substantially constant depth in a portion thereof contacting said device isolation film and in a portion thereof not contacting said device isolation film.

11. The semiconductor device according to claim 10, wherein said device isolation film extends at least to an upper surface of said second silicide film at an interface of said device isolation film and said second silicide film.

12. The semiconductor device according to claim 10, wherein said device isolation film projects upwardly beyond an upper surface of said second silicide film at an interface of said device isolation film and said second silicide film.

13. A semiconductor device comprising:
    a substrate having a MOS transistor region and a bipolar transistor region; and
    a device isolation film separating the MOS transistor region from the bipolar transistor region;
    wherein said MOS transistor region comprises a first silicide film contacting said device isolation film at one side thereof, and said bipolar transistor region comprises a second silicide film contacting said device isolation film at an opposite side thereof;
    wherein said device isolation film is taller at said opposite side than said one side.

14. The semiconductor device according to claim 1, wherein the bipolar transistor region comprises an emitter region contacting the device isolation film.

15. A semiconductor device comprising:
    a substrate having a MOS transistor region and a bipolar transistor region; and
    a device isolation film separating the MOS transistor region from the bipolar transistor region;
    wherein the bipolar transistor region contacts the device isolation film at one side thereof, and wherein the device isolation film is taller at the one side than another side thereof.

16. The semiconductor device according to claim 15, wherein the bipolar transistor region comprises an emitter region contacting the device isolation film.

17. A semiconductor device comprising:
    a substrate having a MOS transistor region and a bipolar transistor region; and
    a device isolation film separating the MOS transistor region from the bipolar transistor region;
    wherein the bipolar transistor region comprises a silicide; film on an upper surface of the substrate, the silicide film the device isolation film at one side thereof, and wherein the device isolation film is taller than an upper surface of the silicide film.

18. The semiconductor device according to claim 17, wherein the bipolar transistor region comprises an emitter region contacting the device isolation film.

19. The semiconductor device according to claim 17, wherein a plurality of MOS transistors having gate insulating films of different thicknesses are formed in the MOS transistor region.

20. The semiconductor device according to claim 15, wherein a plurality of MOS transistors having gate insulating films of different thicknesses are formed in the MOS transistor region.

21. The semiconductor device according to claim 1, wherein the bipolar transistor region comprises an emitter region contacting the device isolation film.

* * * * *